(12) United States Patent
Kosowsky

(10) Patent No.: US 6,797,145 B2
(45) Date of Patent: Sep. 28, 2004

(54) CURRENT CARRYING STRUCTURE USING VOLTAGE SWITCHABLE DIELECTRIC MATERIAL

(76) Inventor: Lex Kosowsky, 5561 Country Club Pkwy., San Jose, CA (US) 95138

( * ) Notice: Subject to any disclaimer, the term of this patent is extended or adjusted under 35 U.S.C. 154(b) by 26 days.

(21) Appl. No.: 10/315,496

(22) Filed: Dec. 9, 2002

(65) Prior Publication Data

US 2003/0079910 A1 May 1, 2003

Related U.S. Application Data

(63) Continuation of application No. 09/437,882, filed on Nov. 10, 1999, now abandoned.
(60) Provisional application No. 60/151,188, filed on Aug. 27, 1999.

(51) Int. Cl.[7] ............................ C25D 5/48; C25D 5/02; C25D 11/32; C25D 5/18
(52) U.S. Cl. ........................ 205/221; 205/103; 205/104; 205/118; 205/125; 205/157
(58) Field of Search ................................ 205/118, 125, 205/157, 158, 103, 104, 221; 427/256, 282; 438/584, 674, 675, 679, 680

(56) References Cited

U.S. PATENT DOCUMENTS 3,926,916 A * 12/1975 Mastrangelo ............... 428/220
5,413,694 A * 5/1995 Dixon et al. ................ 205/158
5,962,815 A * 10/1999 Lan et al. ................... 174/262

FOREIGN PATENT DOCUMENTS

JP           56091464 A   *   7/1981   ........... H01L/27/10

* cited by examiner

Primary Examiner—Edna Wong
(74) Attorney, Agent, or Firm—Carr & Ferrell LLP

(57) ABSTRACT

An electrochemical processing method is provided for forming a current carrying device for semiconductor chip packaging and similar applications. The method comprises selecting sections of a substrate to carry current wherein a selected section is at least partly covered with a voltage switchable dielectric material, rendering the voltage switchable dielectric material conductive, and electrochemically forming a current carrying material directly on the voltage switchable dielectric material. The voltage switchable dielectric material can have a characteristic voltage, such that when a voltage having a magnitude exceeding the characteristic voltage is applied to the voltage switchable dielectric material, the voltage switchable dielectric material switches from a dielectric material to a conductive material. When conductive, the voltage switchable dielectric material is amenable to electrochemical processing such as electroplating.

26 Claims, 8 Drawing Sheets

CURRENT CARRYING STRUCTURE USING VOLTAGE SWITCHABLE DIELECTRIC MATERIAL

CROSS REFERENCE TO RELATED APPLICATION

This application is a continuation of U.S. application Ser. No. 09/437,882, filed Nov. 10, 1999, now abandoned, and claims benefit of U.S. Provisional Application No. 60/151,188, filed on Aug. 27, 1999. These applications are hereby incorporated by reference herein.

BACKGROUND OF THE INVENTION

1. Field of the Invention

This invention relates to the field of current carrying devices and components. In particular, the invention relates to a current carrying device including a substrate and a conductive layer.

2. Description of the Related Art

Current carrying structures are generally developed using a process in which a substrate is subjected to a series of manufacturing steps. Examples of such current carrying structures include printed circuit boards, printed wiring boards, backplanes, and other micro-electronic types of circuitry.

The manufacturing steps are typically performed on a substrate made of rigid, insulative material such as epoxy-impregnated glass fiber laminate. Conductive material such as copper is formed according to a pattern defining conductors, including ground and power planes.

Some previous current carrying devices are manufactured by layering a conductive material over a substrate. A mask layer is then deposited on the conductive layer. The mask layer is exposed and developed. The resulting pattern determines select regions where conductive material is to be removed from the substrate. The conductive layer is removed from the select regions by etching. The mask layer is subsequently removed, providing a patterned layer of conductive material on a surface of the substrate.

In other known processes, an electroless process is used to deposit conductive lines and pads on the substrate. A plating solution is applied to enable conductive material to adhere to the substrate on selected portions of the substrate to form patterns of conductive lines and pads.

To maximize available circuitry in a limited footprint, substrate devices sometimes employ multiple substrates, or use both surfaces of one substrate to include componentry and circuitry. The result in either case is that multiple substrate surfaces in one device need to be interconnected to establish electrical communication between components on different substrate surfaces.

Previous devices develop sleeves or vias that extend through the substrate. In multi-substrate devices, vias extend through at least one substrate to interconnect one surface of that substrate to a surface of another substrate. The sleeves or vias are provided with conductive layering to establish an electrical connection between the substrate sides being interconnected. In this way, an electrical link is established between electrical components and circuitry on two surfaces of the same substrate, or on surfaces of different substrates.

With previous devices, vias can be plated by seeding surfaces with conductive materials. During an electrolytic process, the surfaces of the vias are plated by bonds formed between the seeded particles and the plating material.

In other devices, via can be provided with a layer of conductive material using adhesives. In these devices, the bond between the vias and conductive material is mechanical in nature.

Certain materials, referred to below as voltage switchable dielectric material, have been used in previous devices to provide over-voltage protection. Electrical resistance properties of such materials regulate voltage surges from, for example, lightning, static discharge, or power surges.

Voltage switchable dielectric material are included in some devices, such as printed circuit boards. In these devices, voltage switchable dielectric material is inserted between conductive elements and the substrate to provide over-voltage protection.

SUMMARY OF THE INVENTION

In an embodiment of the invention, a substrate comprises a voltage switchable dielectric material. A current carrying formation is formed on a plurality of selected sections of a surface of the substrate.

In another embodiment, a substrate comprises a voltage switchable dielectric material. The substrate includes a first surface and a second surface opposite to the first surface. A via extends between the first surface and the second surface of the substrate. A current carrying formation is formed on a plurality of selected sections of the first and second surfaces, as well as on a surface of the substrate defining the via to extend an electrical connection from the first surface to the second surface.

In another embodiment, a multi-substrate device includes a first and second substrate. The first substrate comprises a voltage switchable dielectric material. A first current carrying formation is formed on a plurality of selected sections of a surface of the first substrate. The second substrate comprises the voltage switchable dielectric material. The second substrate is positioned adjacent to the first substrate. A second current carrying formation is formed on a plurality of sections of a surface of the second substrate.

Another embodiment includes a substrate comprising a voltage switchable dielectric material, and a current carrying formation formed on a plurality of selected sections of a surface of the substrate. The current carrying formation is formed on the surface of the substrate by a process that includes contacting the substrate with a current carrying formation precursor while applying a voltage to the substrate that is sufficient to cause the substrate to be conductive.

Another embodiment of the invention includes a substrate that comprises a voltage switchable dielectric material. The substrate includes a first surface opposing a second surface on the substrate. A via extends between the first surface and the second surface. A current carrying formation is formed on a plurality of selected sections of the first and second surfaces, as well as on the surface of the substrate defining the via. The current carrying formation is formed on the substrate by one or more processes, each process including contacting the substrate with a current carrying formation precursor while applying a voltage to the substrate that is sufficient to cause the substrate to be conductive.

In another embodiment of the invention, a multi-substrate device includes a first substrate comprising a voltage switchable dielectric material. A first current carrying formation is formed on a plurality of selected sections of a surface of the first substrate, where the first current carrying formation is formed by a process that includes applying a first voltage to the first substrate that is sufficient to cause the first substrate to be conductive. The device also includes a second substrate comprising a voltage switchable dielectric material. The second substrate is positioned adjacent to or stacked on the first substrate. A second current carrying formation is formed on a plurality of selected sections of a surface of the second substrate, where the second current carrying formation is formed by the process that includes applying a second voltage to the second substrate that is sufficient to cause the second substrate to be conductive.

In another embodiment, a device includes a substrate comprising a voltage switchable dielectric material. A formation comprising current carrying material is positioned adjacent a plurality of selected sections of a surface of the substrate between the substrate and the formation, the current carrying material adjacent the substrate being electrobonded to the substrate.

In another embodiment of the invention, a device includes a first substrate comprising a voltage switchable dielectric material. A first formation comprises current carrying material positioned adjacent a plurality of selected sections of a surface of the first substrate, where the current carrying material adjacent the first substrate is electrobonded to the first substrate. The device also includes a second substrate comprising voltage switchable dielectric material, where the second substrate is adjacent the first substrate. A second formation comprising current carrying material is positioned adjacent to a plurality of selected sections of a surface of the second substrate, the current carrying material adjacent the substrate being electrobonded to the substrate.

In a variation, the device includes a via interconnecting the surface of the first substrate with the surface of the second substrate. The via is defined by a surface. The surface includes a layer of current carrying material that is electrobonded to the surface defining the substrate.

Another embodiment of the invention provides a method for forming a current carrying device, the method comprising: taking a structure comprising a voltage switchable dielectric material; applying a voltage to make the voltage switchable dielectric material conductive while electrodepositing current carrying materials on selected regions of the structure.

Another embodiment of the invention provides a method of for forming a current carrying device, the method comprising: taking a structure comprising a voltage switchable dielectric material; depositing a formation of current carrying material onto selected sections of a surface of the substrate, the current carrying material adjacent the substrate being electrobonded to the substrate.

In a variation to the embodiment, the method comprises forming a patterned non-conductive layer on the surface of the structure before subjecting the structure to the electrolytic process, the pattern of the non-conductive layer defining the selected regions where the current carrying materials form.

In a variation to the embodiment, the method includes patterning the non-conductive layer to form gaps in which the structure is exposed to an electrolytic solution while in the conductive state.

Another embodiment of the invention provides a method for forming a current carrying device, the method comprising: taking a first substrate comprising a voltage switchable dielectric material; forming a via within the first substrate; patterning a first non-conductive layer on a surface of the first substrate; depositing a current carrying precursor over the first substrate while applying a voltage to the first substrate that is sufficient to cause the first substrate to be conductive, a pattern of the first non-conductive layer causing the current carrying precursor to form a first current carrying formation on the surface of the first substrate and on a surface of the via and aligning a second substrate over the first substrate so that a current carrying portion of the second substrate is electrically contactable with the surface of the first substrate by way of the surface defining the via.

In a variation, the method comprises depositing a voltage switchable dielectric material to form the second substrate; patterning a second non-conductive layer on a surface of the second substrate; and depositing a current carrying precursor over the second substrate while applying a voltage to the second substrate that is sufficient to cause the second substrate to be conductive, a pattern of the second non-conductive layer causing the current carrying precursor to form a second current carrying formation on the surface of the second substrate.

In a variation to the method, the current carrying formation on the surface of the first substrate includes: immersing a portion of the first substrate including the surface and a portion of the substrate containing the vias in a solution; and directing electrolytes in the solution to the first substrate while applying the voltage to the first substrate that is sufficient to cause the first substrate to be conductive.

In another variation to the invention, applying the voltage to the first substrate that is sufficient to cause the first substrate to be conductive includes applying a periodic voltage having a positive amplitude that is sufficient to cause the first substrate to be conductive.

In another variation, applying the voltage to the first substrate that is sufficient to cause the first substrate to be conductive includes applying a rectified reverse periodic voltage having the positive amplitude that is sufficient to cause the first substrate to be conductive.

Under another embodiment of the invention, a semiconductor device includes a substrate upon which circuitry forming the functionality of the semiconductor device is positioned, wherein the improvement comprises: the substrate comprising a voltage switchable dielectric material, and a current carrying formation formed on a plurality of selected sections of a surface of the substrate.

BRIEF DESCRIPTION OF THE FIGURES

FIG. 3A illustrates a step for forming a substrate of voltage switchable dielectric material.

FIG. 3B illustrates a step of depositing a non-conductive layer on the substrate.

FIG. 3C illustrates a step of patterning a non-conductive layer on the substrate.

FIG. 3D illustrates a step of forming a conductive layer using the pattern of the non-conductive layer.

FIG. 3E illustrates a step of removing the non-conductive layer from the substrate.

FIG. 3F illustrates the step of polishing the conductive layer on the substrate.

DETAILED DESCRIPTION

Figure 1:
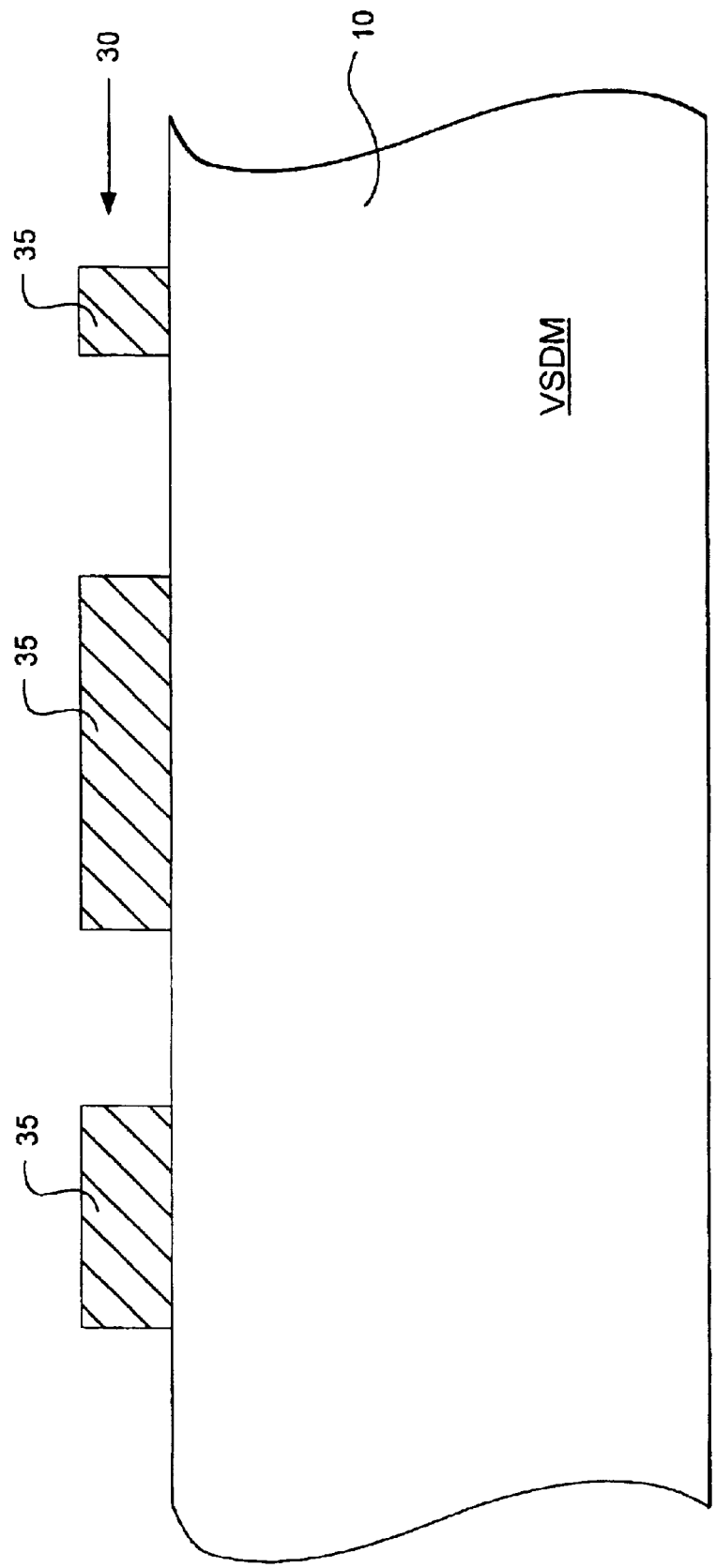
FIG. 1 illustrates a single-sided substrate device including a voltage switchable dielectric material, under an embodiment of the invention.

Embodiments of the invention use a class of material, referred herein as voltage switchable dielectric material, to develop current carrying elements on a structure or substrate. Electrical resistive properties of voltage switchable dielectric material enable substrates to exist in a non-conductive state, but also to switch to a conductive state by an applied voltage. The substrate or structure formed from voltage switchable dielectric material is subjected to an electrochemical process when a voltage is applied to render it conductive. This causes current carrying material to be formed on the substrate. The current carrying materials can be deposited on select regions of the substrate to form a patterned current carrying layer. The applied voltage is removed so that the substrate or structure is non-conductive after the current carrying layer has been patterned.

As will be further described, embodiments of the invention provide significant advantages over previous devices having current carrying structures. Among other advantages, current carrying material can be patterned onto the substrate in fewer number of steps. This allows costly and time-consuming steps such as etching and electroless processes to be avoided.

Voltage switchable materials may also be used for dual-sided and multi-substrate devices having two or more substrate surfaces containing electrical components and circuitry. Vias in substrates formed from voltage switchable dielectric material interconnect electrical components and circuitry on different substrate surfaces.

Vias include any opening of a substrate or device that can be provided a conductive layer for the purpose of electrically interconnecting two or more substrate surfaces. Vias include voids, openings, channels, slots, and sleeves that can be provided a conductive layer to interconnect electrical components and circuitry on different substrate surfaces.

Under embodiments of the invention, plating vias can be accomplished during a relatively simple electrochemical process. For example, vias in a voltage switchable dielectric material substrate may be plated using an electrolytic process. The vias can also be formed concurrently during the electrolytic process used to pattern one or more conductive layers on substrate surface(s) of the device.

In an embodiment of the invention, a current carrying structure is formed from a voltage switchable dielectric material. A current carrying formation can be formed on a plurality of selected sections of a surface of the substrate.

As used herein, formed includes causing the current carrying formation to form through a process in which current carrying material is deposited in the presence of a current applied onto the substrate. Current carrying material may be electrodeposited on the surface of the substrate, through processes such as electroplating, plasma deposition, vapor deposition, electrostatic processes or hybrids thereof. Other processes may also be used to form the current carrying formation in the presence of an electrical current.

The current carrying formation may be incrementally formed so that a thickness of the current carrying formation is developed by deposition of like material onto selected sections of the substrate.

An electrobonding interface is formed between the current carrying formation and the substrate. The electrobonding interface comprises an interface layer of electrobonds between the current carrying formation and the substrate. The electrobonds are bonds formed between molecules of the substrate and current carrying molecules that are electrodeposited onto the substrate. The electrobonds form in regions of the substrate where additional current carrying material is deposited to form the current carrying formation.

The electrobonds form between current carrying molecules and voltage switchable dielectric material molecules of the substrate. Thus, electrobonds exclude bonds formed as a result of an electroless processes where molecules may mechanically or otherwise be added to a surface of the substrate to bond with current carrying material. Electrobonds exclude bonds formed in processes that include, for example, seeding conductive material onto the substrate using adhesives and other types of mechanical or chemical bonds. Examples of processes where current carrying material may be electrodeposited to form electrobonds include electroplating, plasma deposition, vapor deposition, electrostatic processes or hybrids thereof.

A nonconductive layer may be patterned on the surface of the substrate to define the selected sections of the substrate. The substrate is then subjected to an electrochemical process to incrementally form the current carrying formation on the selected regions of the substrate.

The non-conductive layer may comprise a resist layer that is removed one the current carrying formation is formed on select regions of the substrate. The non-conductive layer can also be formed from screened resist patterns, which can be permanent or removed on the substrate.

As used herein, "current carrying" refers to an ability to carry current. Current carrying structure may include, for example, substrates having conductive or magnetic properties. Current carrying is not exclusive to meaning actively carrying current, but includes a physical property corresponding to an ability to carry current upon being applied a voltage. Examples of current carrying materials include magnetic and conductive materials.

A voltage switchable dielectric material is a material that is non-conductive until a voltage is applied that exceeds a characteristic threshold voltage value, in which case the material becomes conductive. Therefore, voltage switchable dielectric material has a non-conductive state, and a conductive state coinciding with when the voltage switchable dielectric material is applied a voltage exceeding the characteristic voltage.

An electrochemical process includes a process in which conductive elements are bonded to voltage switchable dielectric material using electrical resistance properties of the voltage switchable dielectric material in the conductive state. An example of an electrochemical process is an electrolytic process. In an embodiment, an electrode is immersed in a fluid and applied a voltage to cause ionic materials from the electrode to transfer and form on another material exposed to the fluid.

In one embodiment, a device includes a single-sided substrate formed from voltage switchable dielectric material. A non-conductive layer is patterned on the substrate to select regions on the surface of substrate. Preferably, the substrate is subjected to an electrolytic process when the voltage switchable dielectric material is in a conductive state. The electrolytic process causes conductive material to incrementally form on the substrate in select regions determined by the pattern of the non-conductive layer.

One advantage of this embodiment is that the current carrying formation can be formed on the structure to have relatively reduced thicknesses in comparison to previous substrate devices. Also, the patterned current carrying formation can be formed without implementing some fabrication steps used with prior art structures, such as, for example, steps of etching, or multiple steps of masking, imaging, and development of resist layers.

In another embodiment of the invention, a dual-sided substrate is formed to include a vias to electrically connect components on both sides of the substrate. Each side of the substrate is formed a patterned current carrying layer. One or more vias extend through the substrate. The substrate can be subjected to one or more electrochemical processes while in the conductive state, causing current carrying material to be formed on selected sections of the substrate, including on surfaces defining the vias. The selected sections of the substrate can be defined by a non-conductive layer, patterned in a previous step.

Several shortcomings exist in previous devices that plate or otherwise provide conductive layers to surfaces defining vias. In previous devices that seed surfaces of vias and then subject the surfaces to an electroplating process, the plating material bonds only to the seeded particles. Seeding conductive particles can be problematic and costly, since it requires additional manufacturing steps. Further, the continuity and dispersion of the particles along surfaces defining the vias is often imperfect. As such, a substantial risk exists that the continuity of the plating is broken at some juncture of the surface of the vias.

Other previous devices use adhesives to form mechanical bonds between surfaces, or particles in the surfaces defining the vias and conductive materials. The mechanical bonds are relatively weak in comparison to electrochemical bonds formed on surfaces of the substrate. The mechanical nature of the bonds formed between surfaces of the vias and conductive materials also make the devices prone to failure.

To compound problems with previous devices, failed plated vias are detrimental to the entire substrate device. Typically, vias are plated into the substrate after the substrate is provided with conductive elements. Failure in the plated vias is not noticed or caused until at least some or all of the substrates in the device are assembled together. If plating the vias fails, re-plating the vias is not feasible in the assembled device. Often, the entire device has to be discarded. Thus, one failed vias in a device having several vias and substrates is enough to cause the entire device, including all of the fabricated substrates, to be discarded.

Among other advantages of this embodiment, problematic methods for forming current carrying formations on surfaces defining vias are avoided. In contrast, embodiments of the invention plate the vias without requiring additional materials that would otherwise be needed to prepare the surface of the vias to bond with conductive material. Additional materials are not needed to plate surfaces of the vias because the voltage switchable dielectric material forming the substrate is conductive during the electroplating process. As such, the bond between the surface of the vias and the current carrying material is an electrical attraction bond formed during an electrochemical process. The bond, herein referred to as an electrochemical bond, is stronger than bonds formed by seeded particles or adhesives. Moreover, surfaces defining the vias contain only voltage switchable dielectric material. Thus, electrical continuity through the vias is ensured.

Under embodiments of the invention, steps for plating vias are simpler than in previous devices. In addition, bonding between the plating and surfaces of the vias is stronger than found in previous devices.

In another embodiment of the invention, a multi-substrate device includes two or more substrates formed from voltage switchable dielectric material. Each substrate can be subjected to an electrochemical process to form a conductive layer. A pattern of each conductive layer is predetermined by patterning a non-conductive layer to define the pattern for the current carrying formation. One or more vias may be used to electrically connect current carrying formations of one or more substrates. Each vias may be formed when the respective substrates are subjected to an electrochemical process.

Among other advantages provided by embodiments of the invention, multi-substrate devices use electrical resistive properties of voltage switchable dielectric material to plate the vias interconnecting the different substrate surfaces. Therefore, current carrying materials can be formed on vias during an electrolytic processes, without having to alter the substrate in regions that define the vias. The resulting current carrying layers forming the vias significantly reduce the risk that the vias fail in establishing electrical contact between substrates. In contrast, previous multi-substrate devices were plagued by occasional ineffective vias, which often resulted the entire multi-substrate device being discarded.

Another advantage provided to embodiments of the invention is that inclusion of a substrate formed from voltage switchable dielectric material also provides voltage regulation protection to the device as a whole.

Numerous applications for embodiments of the invention exist. Embodiments of the invention may be employed for use with, for example, substrate devices such as PCBs, surface mount components, pin connectors, smart cards, and magnetically layered material.

A. Single Substrate Devices

FIG. 1 is a cross-sectional view of a device incorporating voltage switchable dielectric material, under an embodiment of the invention. In this embodiment, the voltage switchable dielectric material is used to form a substrate 10 of the device. The voltage switchable dielectric material is non-conductive but can be switched to become conductive by being applied a voltage having a magnitude that exceeds a characteristic voltage of the material. Numerous examples of a voltage switchable dielectric material have been developed, including those described in references recited with FIG. 2. Applications in which current carrying substrates are used include, for example, printed circuit boards (PCBs), printed wiring boards, semiconductor wafers, flex circuit boards, backplanes, and integrated circuit devices. Specific applications of integrated circuit include devices having computer processors, computer readable memory devices, motherboards, and PCBs.

The voltage switchable dielectric material in the substrate 10 allows for the formation of a patterned current carrying formation 30. The current carrying formation 30 is a combination of individual current carrying elements 35 formed onto the substrate 10 according to a predetermined pattern. The current carrying formation 30 includes conductive materials. The current carrying formation 30 is formed from precursors deposited on the substrate 10 during an electrochemical process in which the voltage switchable dielectric material is rendered conductive by an applied voltage (see FIG. 4). In an embodiment, the precursors are ions deposited from an electrode into a solution. The substrate 10 is exposed to the solution while the voltage switchable dielectric material is conductive.

The precursors selectively form on the substrate 10 according to a predetermined pattern. The predetermined pattern is formed by patterning a non-conductive layer 20 (see FIGS. 3B–3D) such as a resist layer. When the voltage switchable dielectric material is conductive, the precursors deposit only on uncovered regions of the substrate 10. The voltage switchable dielectric material in the conductive state can form electrochemical bonds with the precursors in uncovered sections of the substrate 10.

In an embodiment, the predetermined non-conductive layer 20 (FIGS. 3B–3D) is formed by a resist layer deposited over the substrate 10. The resist layer is then masked and exposed. The pattern uncovered on the substrate 10 is where the precursors bond during the electrolytic process (as described with respect to FIG. 4).

Figure 2:
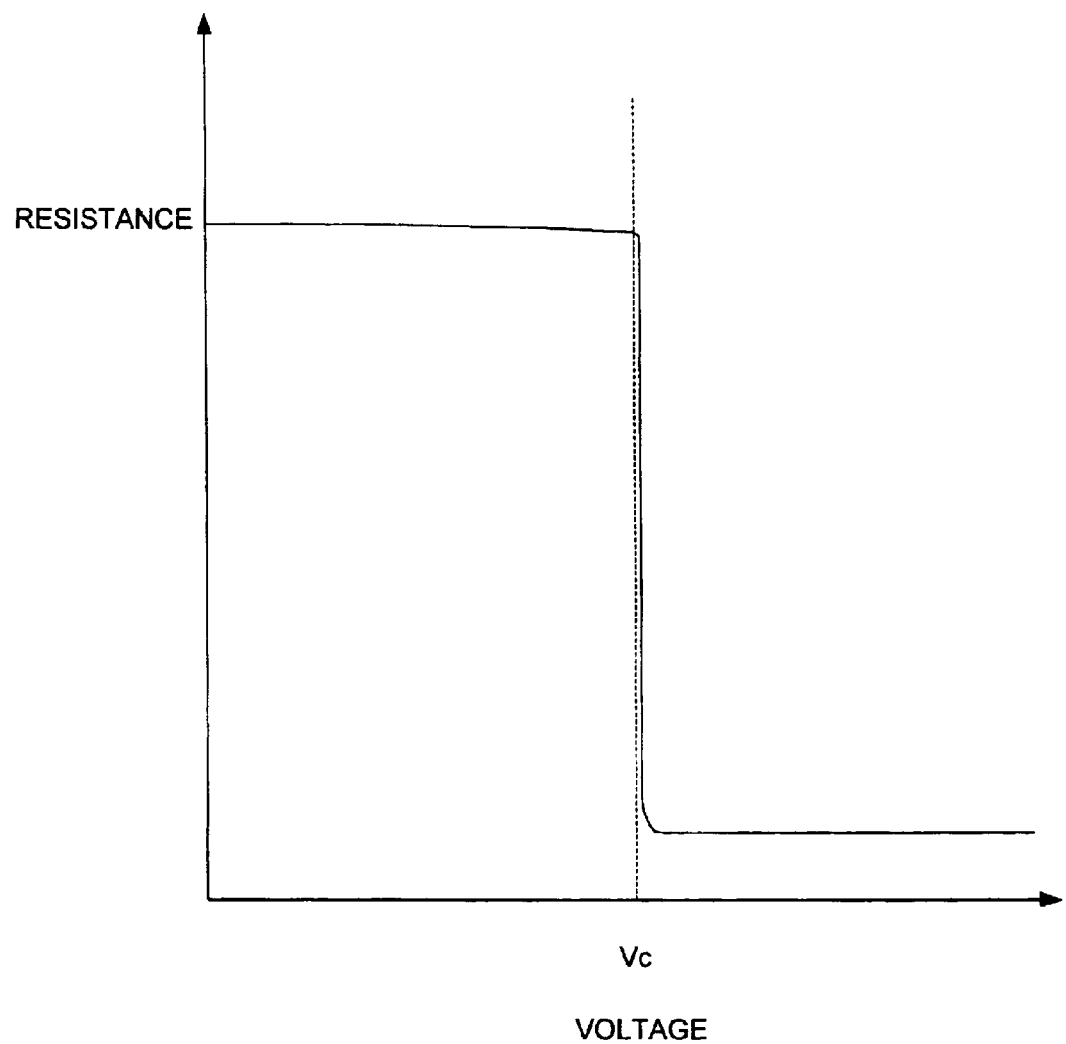
FIG. 2 illustrates electrical resistance characteristics of a voltage switchable dielectric material, under an embodiment of the invention.

FIG. 2 illustrates resistive properties of the voltage switchable dielectric material as a function of voltage. The voltage switchable dielectric material used to form the substrate has a characteristic voltage value (Vc) specific to the type, concentration, and particle spacing of the material's formulation. A voltage (Va) can be applied to the voltage switchable dielectric material to alter the electrical resistance properties of the material. If the magnitude of Va ranges between 0 and Vc, the voltage switchable dielectric material has a high electrical resistance and is therefore non-conductive. If the magnitude of Va exceeds Vc, the voltage switchable dielectric material transforms into a low electrical resistance so that it is conductive. As shown by FIG. 2, the electrical resistance of the substrate preferably switches from high-to-low, so that the transformation from being in a non-conductive to a conductive state is immediate.

In an embodiment, Va ranges between 10 and 100 volts to render the voltage switchable dielectric material conductive. Preferably, Va is between 30 and 50 volts, using one of the compositions for voltage switchable dielectric material listed below.

In an embodiment, a voltage switchable material is formed from a mixture comprising conductive particles, filaments or powder dispersed in a layer including non-conductive binding material and a binding agent. The conductive material may form the greatest proportion of the mixture. Other mixtures that are non-conductive below an applied threshold voltage are intended to be included as voltage switchable dielectric materials under embodiments of this invention.

A specific example of a voltage switchable dielectric material is provided by a material formed from a 35% polymer binder, 0.5% cross linking agent, and 64.5% conductive powder. The polymer binder includes Silastic 35U silicone rubber, the cross-linking agent includes Varox peroxide, and the conductive powder includes nickel with 10 micron average particle size. Another formulation for a voltage switchable material includes 35% polymer binder, 1.0% cross linking agent, and 64.0% conductive powder, where the polymer binder is Silastic 35U silicone rubber, the cross-linking agent is Varox peroxide, and the conductive powder is nickel with 10 micron average particle size.

Other examples of conductive particles, powders, or filaments for use as a voltage switchable dielectric material include aluminum, berylium, iron, silver, platinum, lead, tin, bronze, brass, copper, bismuth, cobalt, magnesium, molybdenum, palladium, tantalum carbide, boron carbide, and other conductive materials known in the art that can be dispersed within a material such as a binding agent.

The non-conductive binding material includes organic polymers, ceramics, refractory materials, waxes, oils, and glasses, as well as other materials known in the art capable of inter-particle spacing or particle suspension.

Examples of voltage switchable dielectric materials are provided in references such as U.S. Pat. No. 4,977,357, U.S. Pat. No. 5,068,634, U.S. Pat. No. 5,099,380, U.S. Pat. No. 5,142,263, U.S. Pat. No. 5,189,387, U.S. Pat. No. 5,248,517, U.S. Pat. No. 5,807,509, WO 96/02924, and WO 97/26665, all of which are incorporated by reference herein. The present invention is intended to encompass modifications, derivatives, and changes to any of the references listed above or below.

Another example of a voltage switchable dielectric material is provided in U.S. Pat. No. 3,685,026 (incorporated by reference herein), which discloses a resin material having finely divided conductive particles. Yet another example of a voltage switchable dielectric material is provided in U.S. Pat. No. 4,726,991 (incorporated by reference herein), which discloses a matrix of separate particles of conductive materials and separate particles of semi-conductor materials coated with insulative material. Other references have previously incorporated voltage switchable dielectric materials into existing devices, such as disclosed in U.S. Pat. No. 5,246,388 (connector) and U.S. Pat. No. 4,928,199 (circuit protection device), both of which are incorporated by reference herein.

FIGS. 3A–3F illustrate a flow process for forming a single layer current carrying substrate shown in FIG. 1, under an embodiment of the invention. The flow process exemplifies a process in which electrical properties of a voltage switchable dielectric material are used to develop a current carrying material according to a predetermined pattern.

Figure 3A:
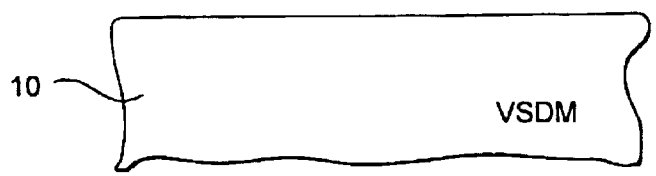
FIGS. 3A–3F show a flow process for forming the device of FIG. 1.

In FIG. 3A, the substrate 10 is formed according to dimensions, shape, composition and properties for a particular application. The composition of the voltage switchable dielectric material can be varied so that the substrate is rigid or flexible, as required by the application. In addition, voltage switchable dielectric material can be shaped for a given application. While some embodiments described herein disclose substrates, other embodiments of the invention may mold or shape the voltage switchable dielectric material into non-planar structures, such as for use with connectors and semiconductor components.

Figure 3B:
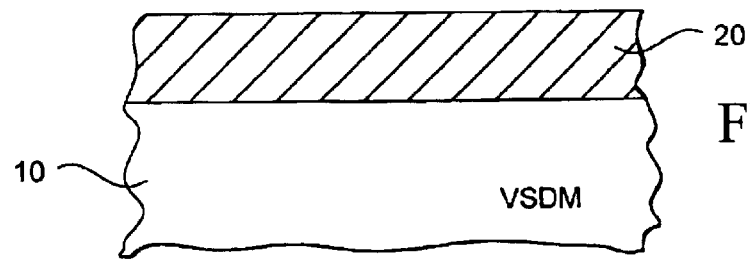

In FIG. 3B, a non-conductive layer 20 is deposited over the substrate 10. The non-conductive layer 20 can be formed from a photoimageable material, such as a photoresist layer. Preferably, the non-conductive layer 20 is formed from a dry film resist.

Figure 3C:
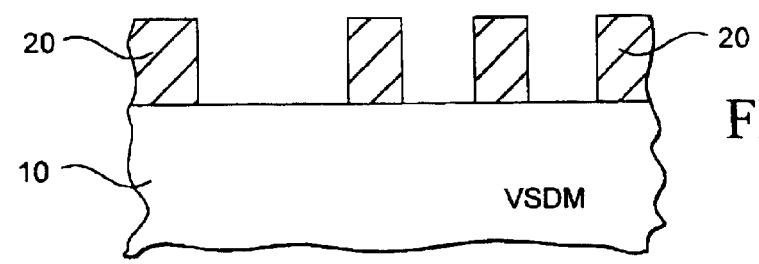

FIG. 3C shows that the non-conductive layer 30 is patterned on the substrate 10. In an embodiment, a mask is applied over the non-conductive layer 30. The mask is used to expose the substrate 10 through the positive photoresist. The pattern of the exposed substrate 10 corresponds to a pattern in which current carrying elements will be formed on the substrate.

Figure 3D:
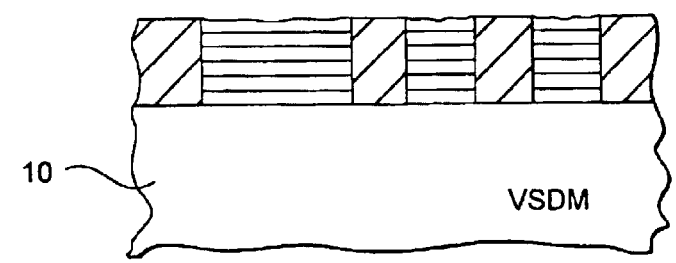

FIG. 3D shows that the substrate 10 is subjected to an electrolytic process while the voltage switchable dielectric material is maintained in a conductive state. The electrolytic process forms a current carrying formation 30 that includes current carrying elements 35 deposited between formations of the patterned non-conductive layer 20. In an embodiment, electroplating process deposits current carrying elements on the substrate 10 in gaps 14 exposed by masking and exposing the photoresist. Thus, the photoresist can be used to form the pattern of the conductive layer 30 in a subsequent electrolytic process. Additional details of the electrolytic process as employed under an embodiment of the invention are described with FIG. 4.

Figure 3E:
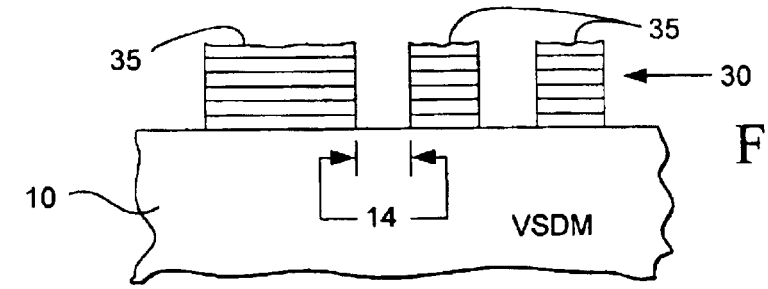

In FIG. 3E, the non-conductive layer 20 is removed as necessary from the substrate. In an embodiment in which the non-conductive layer 20 is the photoresist, the photoresist is stripped from the surface of the substrate 10 using a base solution, such as a potassium base (KOH). Still, other embodiments may employ water to strip the resist layer.

Figure 3F:
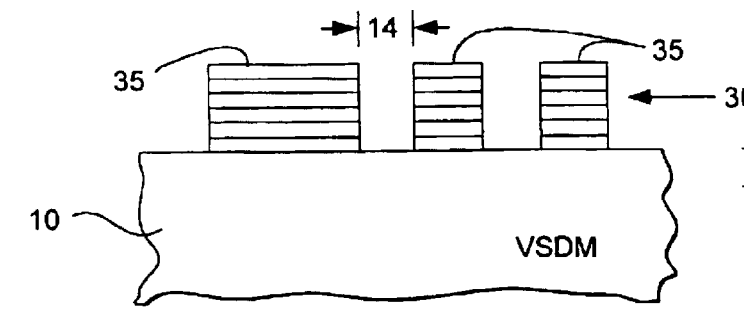

In FIG. 3F, the resulting conductive layer 30 patterned onto the substrate 10 is polished. An embodiment employs chemical-mechanical polishing (CMP) means.

Figure 4:
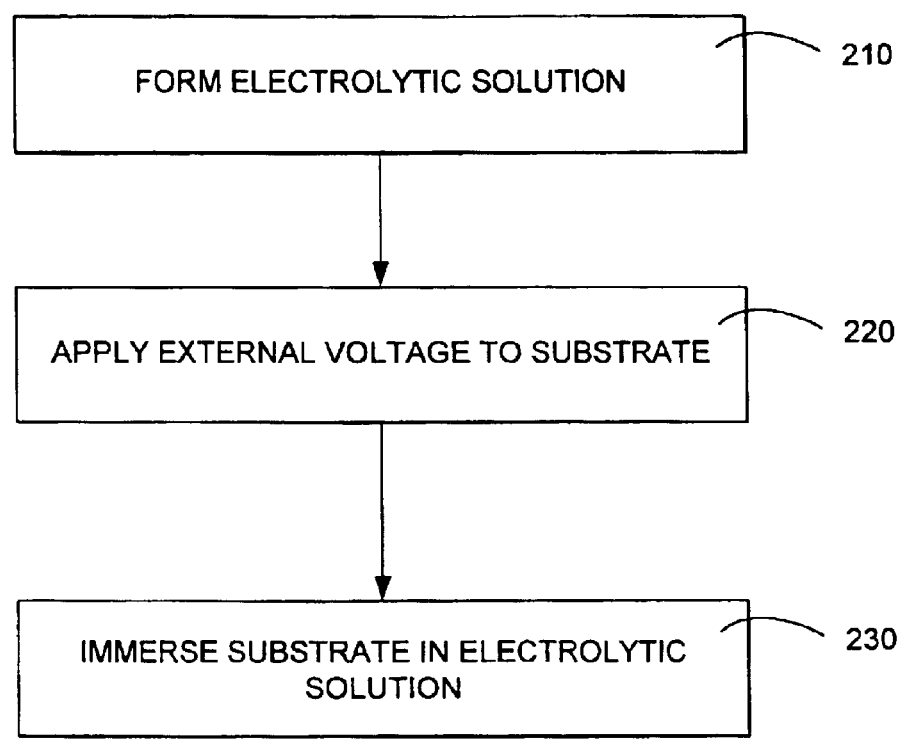
FIG. 4 details a process for electroplating current carrying structures on a substrate formed from voltage switchable dielectric material, under an embodiment of the invention.

FIG. 4 details the development of circuit carrying elements on the substrate by use of an electroplating process. In a step 210, the electroplating process includes forming an electrolytic solution. The electrode used to form the electrolytic solution is selected according to factors such as cost, electrical resistance, and thermal properties. Depending on the application, for example, the electrode used to form the electrolytic solution can be gold, silver, copper, tin, or aluminum. The electrode can be immersed in a solution including, for example, sulfate plating, pyrophosphate plating, and carbonate plating.

In step 220, a voltage is applied to the substrate 10 while the substrate immersed in the electrolytic solution. The applied voltage exceeds the characteristic voltage of the voltage switchable dielectric material. The substrate 10 switches to a conductive state, such as illustrated by FIG. 2. Once the voltage is applied, the substrate 10 is conductive, causing precursors in the electrolytic solution to bind to the voltage switchable dielectric material.

In step 230, ions from the electrolytic solution are allowed to bond to the substrate 10. The ions from the solution only bond to areas of the substrate 10 that are exposed after the non-conductive layer 20 (FIGS. 3b–3D) is patterned. In an embodiment, ions are precluded from forming in regions where the photo-resist is exposed and developed. The substrate 10 in the conductive states attracts and bonds to the ions that accumulate in regions exposed through the photoresist. Therefore, the pattern of conductive material formed on the substrate 10 matches the positive mask used to pattern the non-conductive layer.

Among advantages provided by an embodiment of the invention, current carrying elements are patterned on a substrate 10 in a process requiring fewer steps than other known processes. For example, in an embodiment, current carrying elements 35 are deposited to form circuitry on the substrate 10, without etching, or deposition of a buffer or masking layer for a subsequent etching step. In addition, embodiments of the invention allow for the current carrying elements 35 to be formed directly on the substrate 10. This allows a vertical thickness defined by location of current carrying element with respect to the substrate to be less than similar devices formed by other processes.

B. Devices Having Dual-Sided Substrates

Certain devices include substrates that employ electrical components on two or more sides. The number of current carrying elements that can be retained on a single substrate is increased when two sides of a single substrate are used to retain the electrical components. As such, dual-sided substrates are often used when high-density distribution of components are desired.

Dual-sided substrates include, for example, PCBs, printed wiring boards, semiconductor wafers, flex circuits, backplanes, and integrated circuit devices. In such devices, a vias or sleeve is typically used to interconnect both planar sides of the substrate. The vias or sleeves establish an electrical continuum between the current carrying elements on each planar side of the substrate.

Figure 5:
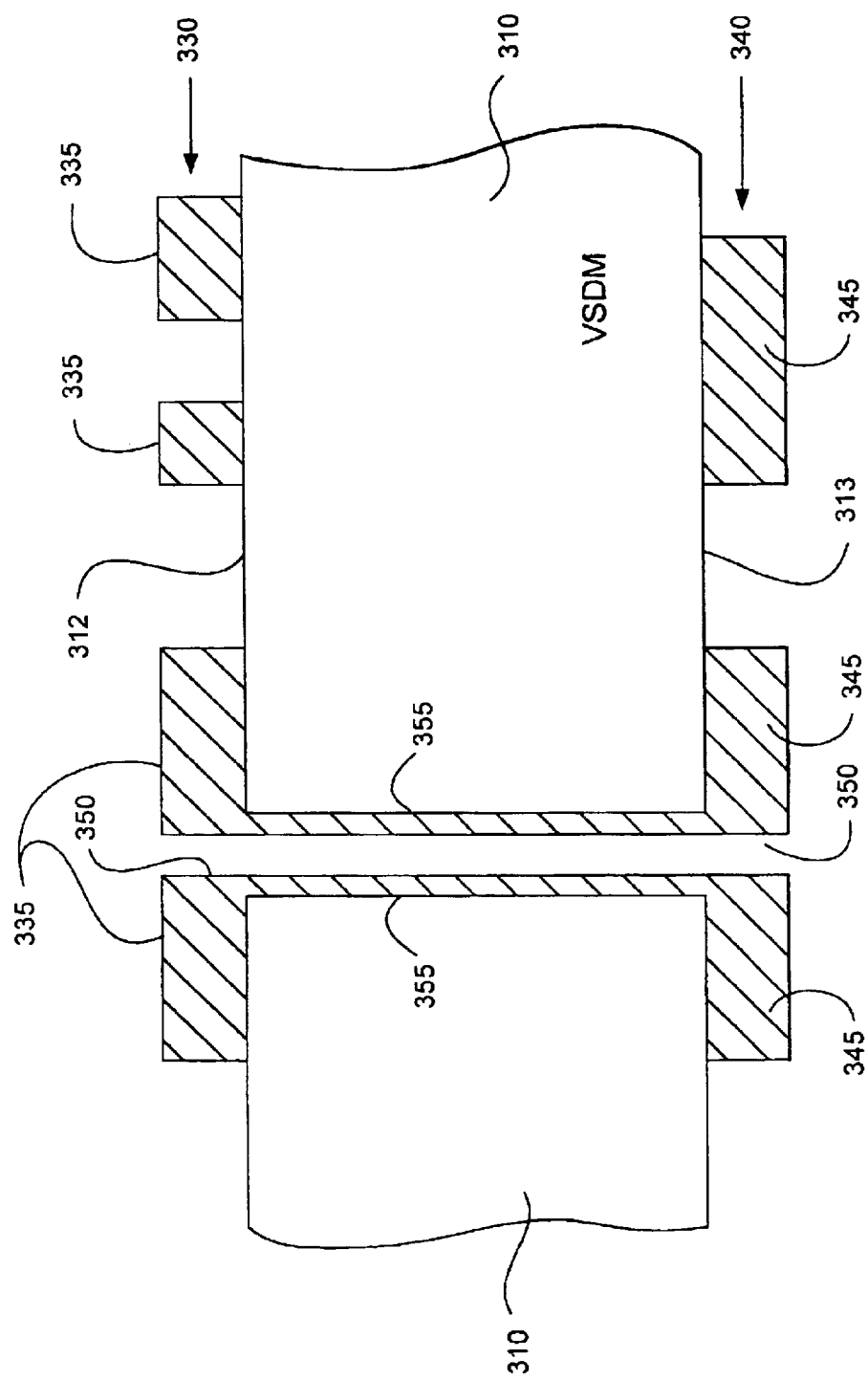
FIG. 5 illustrates a dual-sided substrate device formed from voltage switchable dielectric material and including a vias interconnecting current carrying formations on both sides of the substrate, under an embodiment of the invention.

FIG. 5 displays an embodiment in which a device includes a dual-sided substrate 310 having one or more plated vias 350. The via 350 extends from a first planar surface 312 of the substrate to a second planar surface 313 of the substrate. The first surface 312 includes a current carrying formation 330 having a plurality of current carrying elements 335. The second surface 313 includes a current carrying formation 340 having a plurality of current carrying elements 345. The current carrying formations 330, 340 are formed on the respective sides 312, 313 of the substrate 310 during an electrochemical process. In an embodiment, an electrolytic process is used to form a solution of precursors that are deposited on the respective first or second surface the substrate when the voltage switchable dielectric material is conductive. The precursors deposit on the substrate 310 according to a pattern of a pre-existing non-conductive layer on the respective first or second surface 312, 313.

In an embodiment, the via 350 is formed in the substrate 310 prior to the substrate being subjected to the electrolytic process. Each side 312, 313 of the substrate 310 includes a patterned non-conductive layer (not shown). In an embodiment, the patterned non-conductive layers are photoresist layers which are subsequently masked and exposed to uncover select regions on the first and second side 312, 313 of the substrate 310.

The via 350 is positioned so that a plated surface of the via 350 subsequently contacts one or more of the current carrying elements 335, 345 on the first and second side 312, 313. Once the substrate 310 is subjected to the electrolytic process, the via 350 is plated while current carrying formations 330 and 340 are formed. The via 350 is then provided a conductive sleeve or side-wall 355 to extend electrical contact from one of the current carrying elements 335 on the first surface 312 with one of the current carrying elements 345 on the second side 313 of the substrate 310.

Figure 6:
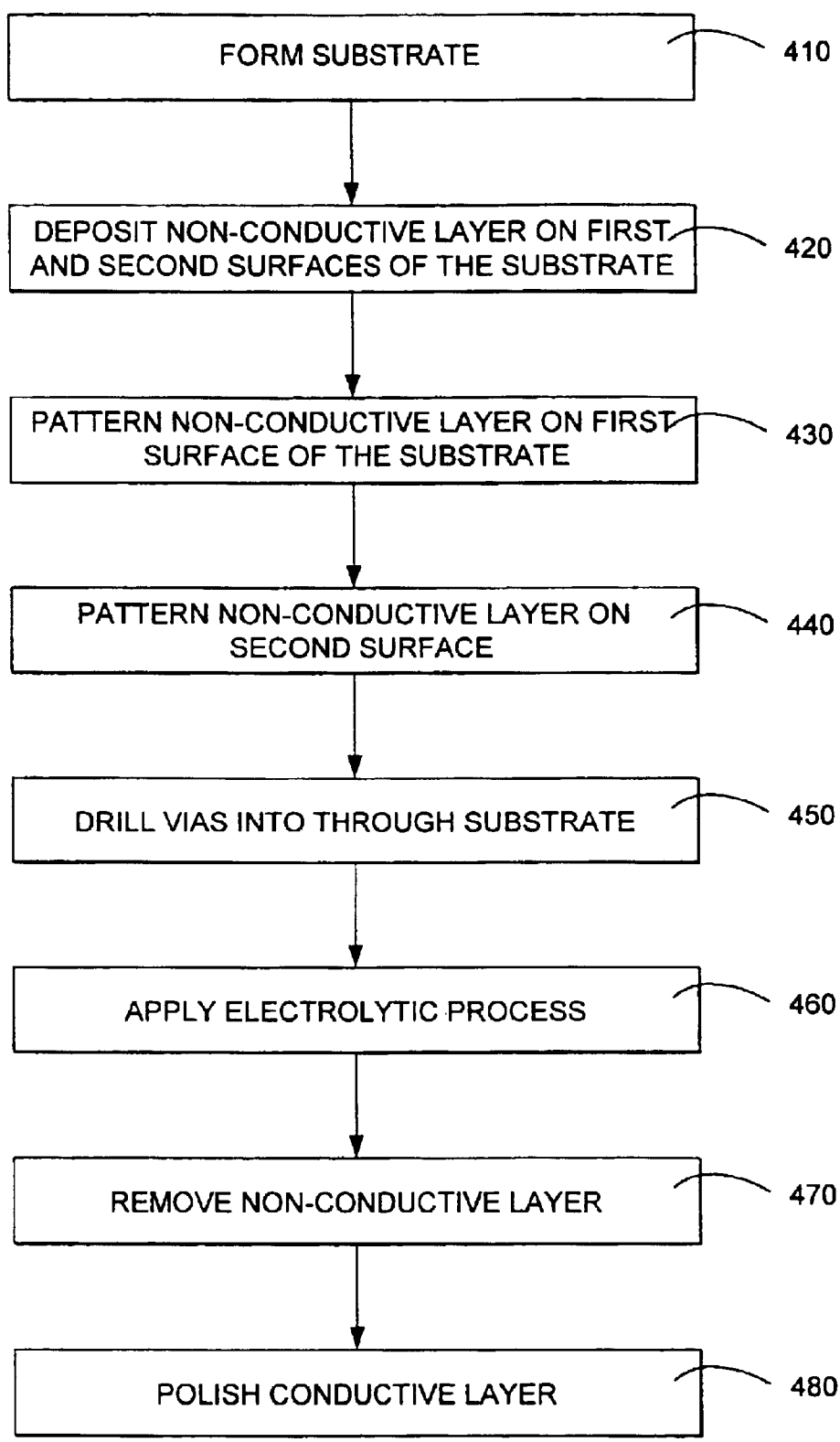
FIG. 6 illustrates a flow process for forming the device of FIG. 5.

FIG. 6 displays a flow process for developing dual-sided substrate 310, under an embodiment of the invention. In step 410, the substrate 310 is formed from voltage switchable dielectric material according to dimensions, shape, properties, and characteristics of a desired application. In step 420, the non-conductive layer is deposited over the first and second side 312, 313 of the substrate 310. In step 430, the non-conductive layer 320 is patterned on the first side 312 of the substrate 310. Preferably, non-conductive material on at least the first side 312 of the substrate 310 is a photo-imageable material, such as a photoresist that is patterned using a positive mask. The positive mask uncovers select regions of the substrate through the non-conductive layer.

In step 440, the non-conductive layer is patterned on the second side 313 of the substrate 310. In an embodiment, the non-conductive layer on the second side 313 of the substrate 310 is also a photoresist that is subsequently masked and exposed to form another pattern. The resulting pattern uncovers the substrate 310 through the photoresist layer.

In step 450, one or more vias 350 are formed into the substrate 310. On each side 312, 313 of the substrate 310, the vias 350 intersect an uncovered portion of the substrate 310. The vias 350 are defined by side-walls formed within the substrate 310.

In step 460, the substrate 310 is subjected to one or more electrolytic processes to plate the first side 312, second side 313, and side-walls within the substrate 310 that define the vias 350. In an embodiment, step 460 provides substrate 310 to be subjected to a single electrolytic process while an external voltage is applied to the voltage switchable dielectric material so that the substrate 310 is in a conductive state. The conductive state of the substrate 310 causes conductive particles in the electrolytic solution to bond to the substrate 310 in uncovered regions on the first and second surfaces 312, 313. The electrolytic fluid is also caused to move through the vias 350 so that conductive particles collect on side-walls that define the vias 350, forming the conductive sleeve 355 that extends through the vias 350. The position of the vias 350 on the first and second sides 312, 313 on the substrate 310 is set to intersect current carrying elements on the first side 312 and the second side 313. This couples the current carrying formation 330 on the first side 312 with the current carrying formation 340 on the second side 313.

The non-conductive layer is removed as necessary from the substrate in step 470. In an embodiment in which the non-conductive layer is the photoresist, the photoresist is stripped from the surface of the substrate using a base solution, such as KOH.

In step 480, the resulting conductive layer patterned onto the substrate 310 is polished. An embodiment employs CMP means to polish the conductive layer on the substrate.

Several variations can be made to the embodiment described by FIGS. 5 and 6. In one variation, a first non-conductive layer can be deposited on the first surface 312, and a second non-conductive layer can be deposited on the second surface 313 in a separate step. The first and second non-conductive layers 312 and 313 can be formed from different materials, and can provide different functions other than enabling patterns to be formed for plating the substrate. For example, the first non-conductive material can be formed from a dry resist, while the second non-conductive layer can be formed from a photo-imageable insulative material that is permanent to the second surface after it is patterned.

Several plating processes may be performed to plate first surface 312, second surface 313, and surface 355 of the vias 350. For example, the second surface 313 of the substrate 310 can be plated in a separate step from the first surface 312 of the substrate 310. This allows the first and second surfaces 312, 313 of the substrate to be plated with electrodes and/or electrolytic solutions that are different from one another. Since embodiments of the invention reduce steps necessary to form current carrying layers, forming current carrying layers 330 and 340 on the dual-sided substrate 310 is particularly advantageous.

Further, embodiments of the invention facilitate current carrying formations of different materials to be formed on different sides of the substrate 310. The substrate can be provided with different types of current carrying material by simply switching the electrolytic baths to include different precursors.

As one example, a device such as a PCB is exposed to the environment on the first side 312, but requires a high-grade conductor on the second side 313. In this example, a nickel pattern be plated on the first side 312 of the substrate 310, and a gold pattern can be plated on the second side 313 side of the substrate. This enables the PCB to have a more protective current carrying material on the exposed side of the PCB.

Any number of vias can be drilled or otherwise formed into the substrate. Vias can interconnect current carrying elements, including electrical components or circuitry. Alternatively, vias can be used to ground a current carrying element on one side of the substrate to a grounding element accessible from a second side of the substrate.

Among advantages included with dual-sided substrates under an embodiment of the invention, precursors from the electrode form an electrochemical bond to surfaces defining the vias 310. The vias 310 are therefore securely plated, with minimal risks of a discontinuity that would interrupt electrical connection between the two sides of the substrate 10.

C. Devices Having Multi-Layered Substrates

Some devices employ multiple current carrying formations by stacking two or more substrates into one device. Stacking substrates enables the device to incorporate a high density of current carrying elements, such as circuitry and electrical components, within a limited footprint.

Figure 7:
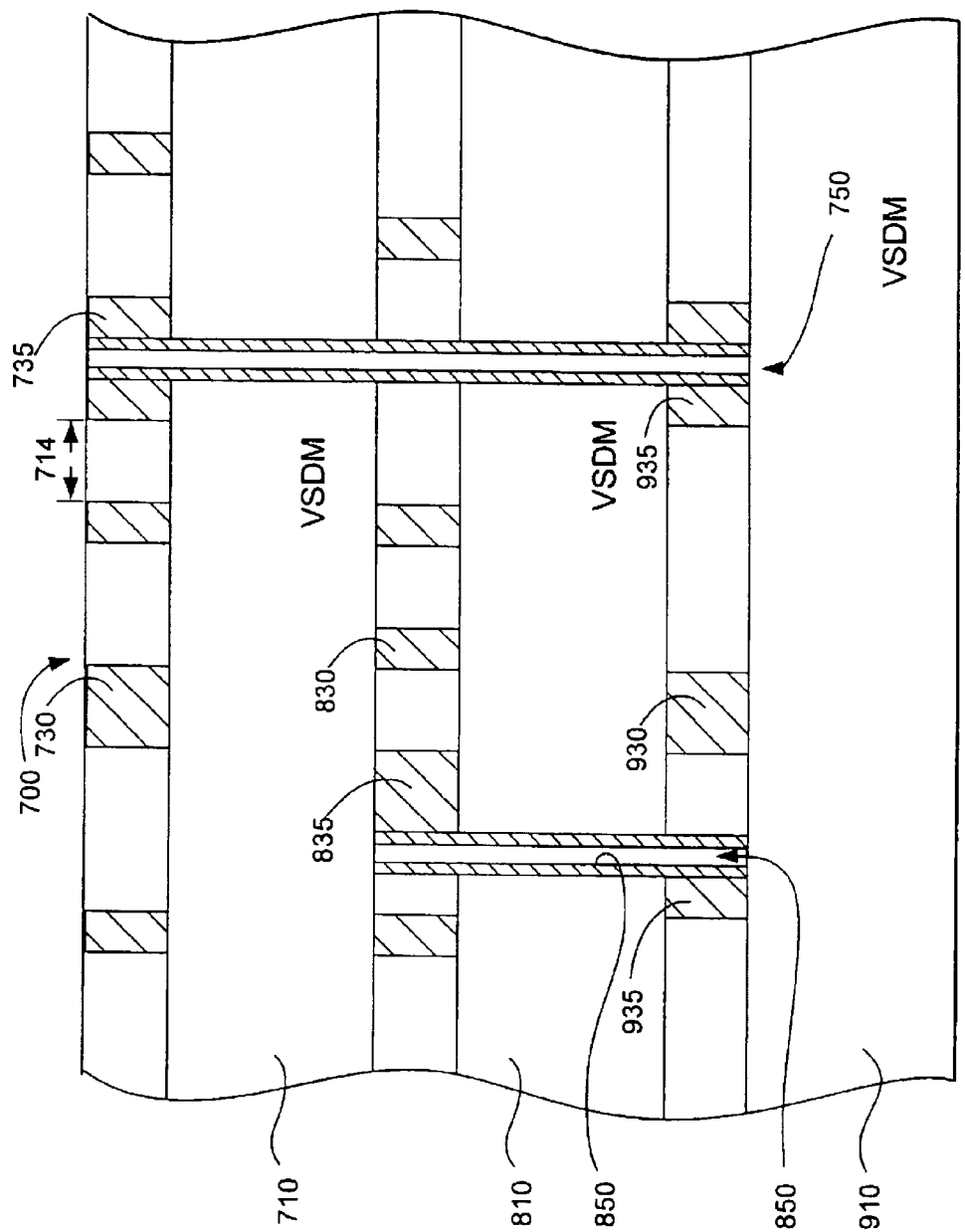
FIG. 7 illustrates a multi-layered substrate device including substrates formed from voltage switchable dielectric material, under an embodiment of the invention.

FIG. 7 illustrates a multi-substrate device 700. In the embodiment shown, the device 700 includes first, second and third substrates 710, 810, 910. Each substrate 710–910 is formed from a voltage switchable dielectric material. As with previous embodiments, the substrates 710–910 are non-conductive absent an applied voltage that exceeds the characteristic voltage of the voltage switchable dielectric material. While FIG. 7 illustrates an embodiment of three substrates, other embodiments may include more or fewer substrates. Substrates may also be aligned in different configurations other than being stacked, such as adjacent or orthanormal to one another.

Each substrate 710–910 is provided at least one current carrying formation 730, 830, 930 respectively. Each current carrying formation 730–930 is formed from a plurality current carrying elements 735, 835, 935 respectively. The current carrying elements 735–935 are each formed when the respective substrate 710, 810, 910 are subjected to an electrochemical process while in a conductive state. Preferably, the substrates 710–910 are mounted on one another after the respective current carrying layers 735–935 are formed.

The device 700 includes a first plated vias 750 to electrically connect current carrying elements 735 on the first substrate 710 to current carrying elements 935 on the third substrate 910. The device 700 includes a second plated vias 850 to electrically connect current carrying elements 835 of the second substrate 810 with current carrying elements 935 of the third substrate 910. In this way, the current carrying formations 730–930 of the device 700 are coupled to one another. The arrangement of plated vias 750, 850 shown in the device 700 is only exemplary, as more or less vias can also be employed. For example, additional vias can be used to connect one of the current carrying elements 735, 835, 935 to any other of the current carrying elements on another substrate.

Preferably, the first and second plated vias 750, 850 are formed in the substrates 710–910 before the substrates 710–910 are individually plated. Thus, prior to plating, the plated vias 750, 850 are formed on the substrates 710–910 in predetermined positions so as to connect current carrying elements of different substrates as necessary. For the first plated vias 750, openings are formed in the substrates 710–910 at predetermined positions prior to any of the substrates 710–910 being plated. Likewise, for the second plated vias 850, openings are formed in the substrates 810, 910 at a predetermined position prior to those substrates 810, 910 being plated. The predetermined positions of the first and second plated vias 750 and 850 correspond to uncovered regions on surfaces of the respective substrates 710–910 in which current carrying material will form. During subsequent electrolytic processes, precursors form in the selected uncovered regions of the substrate, as well as the openings formed in each substrate 710–910 to accommodate either of the plated vias 750, 850.

For simplicity, details of device 700 will be described with reference to the first substrate 710. The first substrate 710 includes gaps 714 between the current carrying elements 735. In an embodiment, gaps 714 are formed by masking a photoresist layer and then removing remaining photoresist after the current carrying elements 735 are formed on the substrate 710. Similar processes are used to form second and third substrates 810, 910.

The first substrate 710 is mounted over the current carrying formation 830 of the second substrate 810. As with the first substrate 710, the second substrate 810 is mounted directly over the current carrying formation 930 of the third substrate 910.

In a variation to embodiments described above, one or more substrates in the device 700 may be dual-sided. For example, the third substrate 910 may be dual-sided, since the location of the third substrate 910 at the bottom of the device 700 readily enables the third substrate to incorporate a double-sided construction. Therefore, the device 700 may include more current carrying formations than substrates to maximize density of componentry and/or minimize the overall footprint of the device.

The composition of the substrates 710–910, as well as the particular current carrying material used for that substrate, may vary from substrate to substrate. Thus, for example, the current carrying formation of the first substrate 710 may be formed from nickel, while the current carrying formation 830 of the second substrate 810 is formed from gold.

Figure 8:
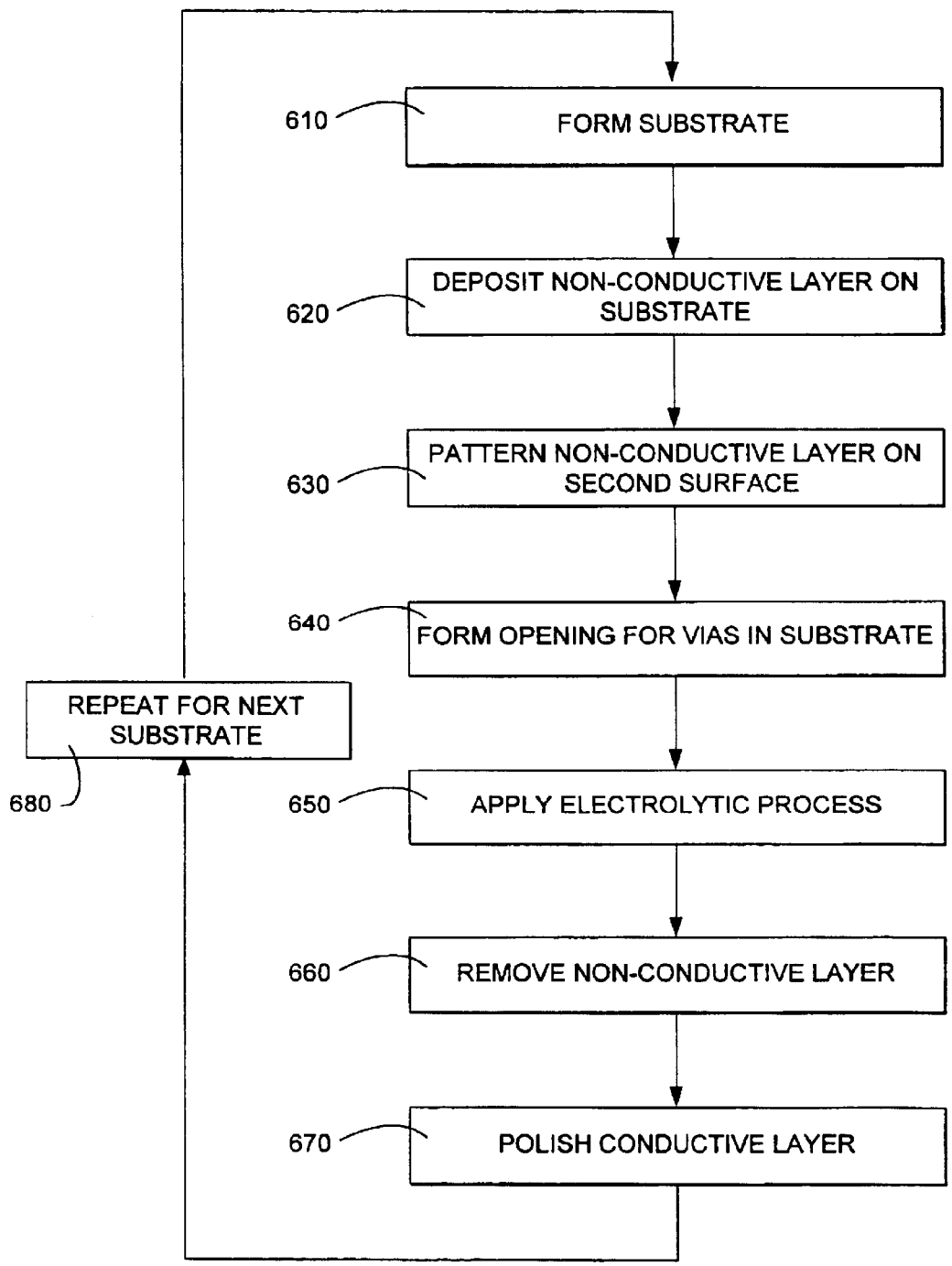
FIG. 8 illustrates a process for forming the multi-substrate device of FIG. 7.

FIG. 8 illustrates a flow process for developing a device having multi-layered substrates, such as the device 700, where two or more of the substrates are formed from voltage switchable dielectric material. The device can be formed from a combination of single and/or double-sided substrates.

In an embodiment, the multi-substrate device 700 comprises separately formed substrates having current carrying formations. With reference to device 700, in step 610, the first substrate 710 is formed from voltage switchable dielectric material. In step 620, a first non-conductive layer is deposited over the first substrate 710. As with previous embodiments, the first non-conductive layer can be a photo-imageable material such as a photoresist layer.

In step 630, the first non-conductive layer is patterned to form selected regions in which the substrate 710 is uncovered. In an embodiment, a photoresist layer is masked and then exposed to form the pattern, so that the substrate is uncovered according to the pattern of the positive mask.

In step 640, the first vias 750 is formed in the substrate 710. The first vias 750 is preferably formed by drilling a hole in the substrate 710. Additional vias can be formed as needed in the substrate. The vias 750 is drilled in a location on the substrate that is predetermined to be where select current carrying elements 735 will be located to connect to current carrying elements of other substrates in the device 700.

In step 650, the first substrate 710 is subjected to an electrolytic process. The electrolytic process employs an electrode and a solution according to design requirements for the first substrate 710. Components of the electrolytic solution, including the electrode and composition of the solution used, are selected to provide the desired precursors, i.e. materials forming the current carrying formation 730.

In step 660, the remaining non-conductive layer on the first substrate 710 is removed. The current carrying elements 735 on the first substrate 710 are then polished in step 670, preferably using a CMP.

Once the first substrate 710 is formed, additional substrates 810, 910 can be formed in step 680 to complete the multi-substrate device 700. Subsequent substrates 810, 910 are formed using a combination of steps 610–670. One or more of the additional vias, such as the second vias 850, may be formed into another substrate as described with steps 640 and 650. The device 700 may include additional substrates formed as described in steps 610–680, or as described for double-sided substrates above.

Variations may be made to each substrate 710–810 as needed. For example, one or more substrates used in the device can have different composites of voltage switchable dielectric material. The external voltage applied to each substrate to overcome the characteristic voltage therefore can vary as between substrates. Materials used in the non-conductive layers can also be varied from substrate to substrate. The non-conductive layers can be patterned with, for example, different masking, imaging, and/or resist development techniques. Further, the materials used to develop current carrying elements on the surfaces of the substrates can be varied from substrate to substrate. For example, the electrodes used to plate each substrate can be altered or changed as between substrates, depending on particular design parameters of that substrate.

Under a variation, it may be preferable for the process to include for at least one double-sided substrate, such as at an end of the stack of substrates. The third substrate 910, for example, can be formed to include current carrying elements 935 on both planar sides. In this variation, a non-conductive layer is deposited on the first side and the second side of the third substrate 910. The non-conductive layer on the second side can be made of the same material as the first side, although in some applications the second side of the substrate may require a different type of photo-imageable material or other non-conductive surface. The non-conductive layers on each side of the third substrate 910 are then individually patterned. The third substrate 910 is uncovered on the first and second sides when the respective non-conductive layers are patterned. Uncovered regions on each side of the substrate may be plated together or in separate plating steps.

Embodiments such as shown above can be used in PCB devices. PCBs have a variety of sizes and applications, such as for example, for use as printed wiring boards, motherboards, and printed circuit cards. In general, a high density of current carrying elements, such as electrical components, leads, and circuitry, are embedded or otherwise included with PCBs. In multi-substrate devices, the size and function of the PCBs can be varied.

A device including a PCB under an embodiment of the invention has a substrate formed from voltage switchable dielectric material. A photoresist such as a dry film resist can be applied over the substrate. An example of a commercially available dry film resist includes Dialon FRA305, manufactured by Mitsubishi Rayon Co. The thickness of the dry film resist deposited on the substrate is sufficient to allow the substrate to become uncovered at selected portions corresponding to where the resist was exposed by the mask. An electroplating process such as described with FIG. 3 is used to plate conductive materials in uncovered regions of the substrate.

Substrates formed from voltage switchable dielectric material can be used for various applications. The voltage switchable dielectric material can be conformed, shaped and sized as needed for the various printed circuit board applications. Examples of printed circuit boards include, for example, (i) motherboards for mounting and interconnecting computer componentry; (ii) printed wiring boards; and (iii) personal computer (PC) cards and similar devices. Still, other applications are provided below.

D. Alternative Embodiments

The following are some examples of variations to one or more embodiments described above.

1. Pulse Plating Process

An embodiment of the invention employs a pulse plating process. In this process, the substrate is applied a voltage so that the voltage switchable dielectric material becomes conductive. The substrate is immersed in an electrolytic solution while in the conductive state. Current carrying element precursors are deposited to form the electrolytic solution by applying a voltage to an electrode. In the pulse plating process, the voltage applied to the electrode is in a rapid step-pulse wave form. In one period, the voltage applied to the electrode alternates between 0 volts a maximum voltage. In the pulse plating process, it is preferable that the maximum voltage be relatively large, such as between 100 and 400 volts.

2. Reverse Pulse Plating Process

Another embodiment of the invention employs a pulse periodic reverse plating process. In this process, a voltage is applied to the substrate so that the voltage switchable dielectric material becomes conductive. The substrate is immersed in an electrolytic solution while in the conductive state. Current carrying element precursors are deposited from the electrolytic solution by applying a rapid, alternating and periodic pulse voltage to an electrode. In one period, the voltage applied to the electrode alternates between a negative and maximum voltage range. As with the pulse plating process, it is preferable that the magnitude of the minimum and maximum voltage be relatively large, such as between 100 and 400 volts. Typically, the voltage applied to the rectifier is produced by coupling a rectifier so as to alternate the voltage between a negative and positive voltage of a specified magnitude.

3. Depositing and Patterning Non-Conductive Layers

Another embodiment of the invention employs a silk-screening method to develop a patterned non-conductive layer on a substrate comprised of voltage switchable dielectric material. This embodiment avoids the use of materials such as photoresist to develop the pattern for depositing current carrying materials on the substrate. In a silk screening process, a robotic dispenser applies a dielectric material to the surface of the substrate according to a preprogrammed pattern. The silkscreen liquid applicant is typically a form of plastic or resin, such as Kapton. In contrast to other embodiments using photoresist materials as the non-conductive layer, silk-screening Kapton or other plastics and resins is permanent to the surface of the substrate. As such, silk-screening offers advantages of combining steps for depositing and patterning non-conductive material on the substrate, as well as eliminating steps for removing non-conductive material from the surface of the substrate.

4. Multiple Types of Conductive Materials on a Single Surface

In addition, current carrying elements may be developed on a surface of a substrate that are formed from two or more types of current carrying materials. The substrate including the voltage switchable dielectric material is adaptable to be plated by several kinds of current carrying materials.

Two or more electrolytic processes can be applied to a surface of a substrate to develop different types of current carrying particles. In one embodiment, a first electrolytic process may be employed to deposit a first conductive material in a first pattern formed on the surface of the substrate. Subsequently, another non-conductive layer is patterned on the substrate including the first conductive material. Another electrolytic process may then be employed to deposit a second conductive material using the second pattern.

In this way, a substrate may include multiple types of conductive material. For example, copper can be deposited to form leads on a substrate. Another conductive material such as gold can be deposited elsewhere on the same surface where superior conduction is necessary.

E. Other Applications for Embodiments of the Invention

Embodiments of the invention include devices formed from deposits of current carrying particles, such as for development of circuits, leads, electrical components, and magnetic material. Some applications for embodiments of the invention are described or listed below. The applications described or listed herein are illustrative of the diversity and flexibility of embodiments of this invention, and should therefore not be construed as an exhaustive list.

1. Pin Connectors

In an embodiment, voltage switchable dielectric material is used to form a pin connector. For example, voltage switchable dielectric material is used to form an interior structure of a female pin connector. Electrical resistance properties of the voltage switchable dielectric material can then be used to form contact leads within the interior structure of the female pin connector.

Voltage switchable dielectric material may be shaped into the interior structure using, for example, a mold that receives the voltage switchable dielectric material in liquid form. The resulting interior structure includes a mating surface that opposes the male pin connector when the two connectors are mated. A plurality of grooves are accessible though holes in the mating surface. The holes and grooves correspond to where pins from the male connector will be received.

To provide conductive contact elements with the connector, the interior structure may be separated to expose the lengths of the grooves that extend to the openings in the mating surface. A non-conductive layer such as a photoresist may be deposited on one of the segments. The non-conductive layer may then be patterned so that a bottom surface of each groove is exposed through the non-conductive layer.

One or both halves of the interior structure may then be subjected to an electrolytic plating process. During the plating process, a voltage is applied to the interior structure so that the voltage switchable dielectric material is conductive. The formation of a non-conductive layer predetermines formation of conductive material on bottom surfaces of each groove in the interior structure.

Once the leads are formed, the non-conductive layer can be removed. The halves forming the structure are joined. The interior structure may be housed with a shell to complete the female pin connector.

Several advantages exist in forming a pin connector under an embodiment of the invention. Plating the interior structure enables a large number of pins to be included in the interior structure in one plating process. Further, contact elements can be formed closer together to reduce dimensions of the large pin connector. The pin connector also includes over-voltage protection properties that are inherent to voltage switchable dielectric material.

2. Surface Mount Packages

Surface mount packages mount electronic components to a surface of a printed circuit board. Surface mount packages house, for example, resistors, capacitors, diodes, transistors, transistors, and integrated circuit devices (processors, DRAM etc.). The packages include leads directed internally or outwardly that connect to the electrical component being housed. Specific examples of surface mounted semiconductor packages include small outline packages, quad flat package, plastic leaded chip carriers, and chip carrier sockets.

Manufacturing such packages involves forming a frame for the leads of the package. The frame is molded using material such as epoxy resin. Thereafter, leads are electroplated into the molded frame.

In an embodiment of the invention, voltage switchable dielectric material can be used to form the frame. A non-conductive layer can be formed on the frame to define the locations of the leads. The non-conductive layer can be formed during the molding process, during a subsequent molding process, or through a photo-imageable material such as described with previous embodiments. The frame is subjected to the electroplating process while being applied a voltage rendering the frame conductive. The leads form on the frame in locations defined by a pattern of the non-conductive layer.

By using voltage switchable dielectric material, the leads formed can be thinner or smaller, allowing for smaller packages that occupy a smaller footprint on the PCB. The voltage switchable dielectric material also inherently acts as a voltage regulator to protect contents of the package from voltage spikes.

3. Micro-Circuit Board Applications

Embodiments of the invention may be implemented with micro-circuit board applications. For example, smart cards are credit-card size substrate devices having one or more embedded computer chips. The componentry of the smart card includes conductors for interconnecting a mounted micro-memory module with other components such as sensors for detecting smart card readers. Due to the size of the smart card, as well as the size of the components embedded or mounted to the smart card, conductive elements on the substrate of the smart card are finely formed.

In an embodiment, voltage switchable dielectric material may be used to form the substrate of a smart card. An electrolytic plating process such as described above may be implemented to produce fine connector patterns on the smart card to interconnect the memory module. A conductive layer may be plated onto the surface of the substrate based on a pattern created by masking and exposing a photoresist layer.

By using voltage switchable dielectric material, conductive patterns may be plated onto the substrate without having to etch. This can reduce the thickness of the conductive layer on the substrate.

Another micro-circuit board application includes a circuit board that packages two or more processors together. The circuit board includes leads and circuits that enable high-level communications between processors mounted on the board so that the processors act substantially as one processing unit. Additional component such as memory may also be mounted to the circuit board to communicate with either of the processors. Fine circuitry and lead patterns are therefore required to preserve processing speed for communications that pass between two or more processors.

As with previous embodiments such as described with smart cards, the micro-circuit board may include a substrate formed from voltage switchable dielectric material. A fine resist layer may be patterned onto the substrate to define a pattern for selected regions of conductive material to be subsequently deposited. An electrolytic process plates conductive material in selected regions according to a pattern to interconnect processors subsequently mounted to the circuit board.

One advantage provided by using voltage switchable dielectric material is that a conductive layer formed of conductive material deposited in select regions of the substrate can be made to have a reduced thickness. Another advantage is that plating conductive material in fewer fabrication steps reduces cost for manufacturing the micro-circuit board.

Still, another advantage is that a micro-circuit board can be developed to have conductive elements formed from more than one type of conductive material. This is particularly advantageous for interconnecting processors on one micro-circuit board because material requirements of the conductors may be varied for each processor, depending on the quality, function, or position of each processor. For example, processors near an external environment of the micro-circuit board may require conductive elements that interconnect the processor to include material such as nickel to withstand temperature fluctuations and heat. Another processor may be delegated more computational demanding functions so to be located away from the environment. Contacts and leads formed from high-quality conductive material such as gold or silver may be required for the other processor.

4. Magnetic Memory Device

In an application, a substrate is integrated into a memory device and includes a plurality of memory cells. The substrate includes a magnetic patch which stores data in the form of a magnetic field. The patches are interconnected by electrical leads. Voltages applied to the magnetic patches via the electrical leads determine the electrical state of each patch. Transistors may be mounted to or formed in the substrate to select the magnetic patches that are applied a voltage.

In an embodiment of the invention, the substrate used in the memory device can be formed from voltage switchable dielectric material. A non-conductive layer may be deposited and patterned on the substrate to define regions where the magnetic patch and/or the electrical leads are to be formed. An electrolytic process may be applied to the substrate to develop the magnetic patches. The electrolytic process may, for example, subject select sections of the substrate to cobalt-chromium (CoCr) film to form each magnetic patch.

Another non-conductive layer may be deposited and masked on the substrate to define regions where electrical leads interconnecting the magnetic patches are to be located.

5. Stacked Memory Devices

Under an embodiment, a multi-substrate memory device includes a plurality of substrates formed from voltage switchable dielectric material. The substrates are stacked over one another and are electrically interconnected using one or more vias. As shown by FIGS. 5 and 7, the vias are plated with a current carrying layer on each of the substrates during an electrolytic process.

Several advantages are apparent under this embodiment of the invention. The vias can be plated during a fabrication step with one or more of the current carrying formations formed on the surface of the respective substrates. The plating on the surface of the vias is less expensive and more reliable than previous methods for plating vias, such as by seeding the surface of the vias or using adhesives.

6. Flex Circuit Board Devices

An embodiment of the invention may be employed with flex circuit board devices. Flex circuit boards generally provide a high density of electrical leads and components. The speed and/or capacity of the flex circuit board may be cancelled by increasing the density of electrical and conductive elements.

Embodiments of the invention provide a flex circuit board that uses voltage switchable dielectric material. The density of electrical and conductive components on the flex circuit board may be increased with the use of voltage switchable dielectric material.

Under an embodiment, a composition of a voltage switchable dielectric material is selected and molded into a flexible and thin circuit board. A resist layer may be patterned onto the substrate to define finely spaced regions in which current carrying materials is to be formed. The voltage switchable dielectric material is then subjected to an electrolytic process while being applied a voltage exceeding the characteristic voltage for the particular composition of voltage switchable dielectric material being used. A resulting current carrying formation includes finely spaced conductive leads and contacts.

By using voltage switchable dielectric material, current carrying precursors may be deposited directly on a surface of the substrate to form the current carrying formation. This allows a thicknesses of the current carrying formation to be reduced in comparison to previous flex circuit board devices. This results in a finer formation of electrical and conductive elements on the surface of the flex circuit board.

An application for a flex circuit board under an embodiment of the invention includes print heads for ink jet style printers. The use of voltage switchable dielectric material enables the flex circuit board to have finely spaced electrical components and leads that increase processing abilities relative to previous devices. As a result, the flex circuit board may contribute to increasing printing resolution from the printer.

CONCLUSION

The foregoing description of various embodiments of the invention has been presented for purposes of illustration and description. It is not intended to limit the invention to the precise forms disclosed. Many modifications and equivalent arrangements will be apparent.

What is claimed is:

1. A method of electrochemical processing, comprising:
   selecting one or more sections of one or more substrates to carry current, wherein at least one of the one or more selected sections is at least partly covered with voltage switchable dielectric material;
   rendering at least part of the voltage switchable dielectric material conductive; and
   electrochemically forming one or more current carrying materials directly on the at least part of the voltage switchable dielectric material at least partly covering the at least one of the one or more selected sections.

2. The method of claim 1, wherein selecting one or more current carrying sections of a substrate is at least partly done with photoresist processing.

3. The method of claim 2, wherein the photoresist processing includes at least negative photoresist processing.

4. The method of claim 2, wherein the photoresist processing includes at least positive photoresist processing.

5. The method of claim 1, wherein selecting one or more current carrying sections of a substrate is at least partly done with silk screening.

6. The method of claim 1, wherein selecting one or more current carrying sections of a substrate is at least partly done with patterning.

7. The method of claim 1, wherein rendering at least part of the voltage switchable dielectric material conductive includes applying one or more voltages having one or more magnitudes exceeding one or more characteristic voltages of the voltage switchable dielectric material.

8. The method of claim 1, wherein electrochemically forming includes electroplating.

9. The method of claim 1, wherein electrochemically forming includes plasma deposition.

10. The method of claim 1, wherein electrochemically forming includes vapor deposition.

11. The method of claim 1, wherein electrochemically forming includes one or more electrostatic processes.

12. The method of claim 1, wherein electrochemically forming includes one or more electrolytic processes.

13. The method of claim 1, wherein the one or more substrates includes one or more printed circuit boards.

14. The method of claim 1, wherein the one or more substrates includes one or more printed wiring boards.

15. The method of claim 1, wherein the one or more substrates includes one or more semiconductor wafers.

16. The method of claim 1, wherein the one or more substrates includes one or more flex circuit boards.

17. The method of claim 1, wherein the one or more substrates includes one or more backplanes.

18. The method of claim 1, wherein the one or more substrates includes one or more integrated circuit devices.

19. The method of claim 1, wherein the one or more substrates includes one or more semiconductor probe cards.

20. The method of claim 1, wherein the one or more substrates includes one or more semiconductor substrates.

21. The method of claim 1, wherein the voltage switchable dielectric material includes one or more polymer binders, one or more cross linking agents, and one or more conductive powders.

22. The method of claim 1, wherein the voltage switchable dielectric material includes one or more polymer binders.

23. The method of claim 1, wherein the voltage switchable dielectric material includes one or more cross linking agents.

24. The method of claim 1, wherein the voltage switchable dielectric material includes one or more conductive powders.

25. The method of claim 1, wherein electrochemically forming includes a pulse plating process.

26. The method of claim 1, wherein electrochemically forming includes a reverse pulse plating process.

* * * * *